United States Patent
Hansen

(10) Patent No.: US 10,240,953 B2
(45) Date of Patent: Mar. 26, 2019

(54) HOUSING WITH A DAMPING ELEMENT FOR A MICROMECHANICAL SENSOR ELEMENT

(71) Applicant: Robert Bosch GmbH, Stuttgart (DE)

(72) Inventor: Uwe Hansen, Tuebingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 43 days.

(21) Appl. No.: 15/119,218

(22) PCT Filed: Dec. 22, 2014

(86) PCT No.: PCT/EP2014/078987
§ 371 (c)(1),
(2) Date: Aug. 16, 2016

(87) PCT Pub. No.: WO2015/120938
PCT Pub. Date: Aug. 20, 2015

(65) Prior Publication Data
US 2017/0010135 A1   Jan. 12, 2017

(30) Foreign Application Priority Data
Feb. 17, 2014  (DE) .................. 10 2014 202 821

(51) Int. Cl.
 *G01D 11/24* (2006.01)
 *B81B 7/00* (2006.01)
 *B81C 1/00* (2006.01)

(52) U.S. Cl.
 CPC .......... *G01D 11/245* (2013.01); *B81B 7/0058* (2013.01); *B81C 1/00325* (2013.01); *B81B 2201/0264* (2013.01); *B81B 2207/012* (2013.01)

(58) Field of Classification Search
None
See application file for complete search history.

(56) References Cited

U.S. PATENT DOCUMENTS

| | | | |
|---|---|---|---|
| 9,366,534 B2 | 6/2016 | Ohta et al. | |
| 2005/0179102 A1* | 8/2005 | Weiblen | G01J 5/12 257/432 |
| 2009/0255340 A1* | 10/2009 | Shizuno | G01P 1/023 73/514.33 |
| 2009/0282815 A1 | 11/2009 | Reinhold et al. | |

(Continued)

FOREIGN PATENT DOCUMENTS

| | | |
|---|---|---|
| CN | 101679016 A | 3/2010 |
| CN | 103493606 A | 1/2014 |

(Continued)

OTHER PUBLICATIONS

International Search Report issued for PCT/EP2014/078987 dated Mar. 17, 2015.

*Primary Examiner* — Paul M. West
*Assistant Examiner* — Mark A Shabman
(74) *Attorney, Agent, or Firm* — Norton Rose Fulbright US LLP; Gerard Messina

(57) ABSTRACT

A housing for a micromechanical sensor element, including a cavity in which the sensor element is disposable, and a damping element, the micromechanical sensor element being immobilizable in the cavity by the damping element so that the damping element and the sensor element together have a substantially common center of mass.

17 Claims, 4 Drawing Sheets

(56) References Cited

U.S. PATENT DOCUMENTS

2011/0041608 A1* 2/2011 Wilner ................ B81B 3/0078
73/504.15
2013/0199295 A1* 8/2013 Hoefer ................. H05K 1/141
73/526

FOREIGN PATENT DOCUMENTS

DE   10 2009 020838 A1   11/2009
DE   10 2010 030960 A1   1/2012

* cited by examiner

HOUSING WITH A DAMPING ELEMENT FOR A MICROMECHANICAL SENSOR ELEMENT

FIELD OF THE INVENTION

The present invention relates to a housing for a micromechanical sensor element. The invention further relates to a method for manufacturing a sensor device.

BACKGROUND INFORMATION

Sensor modules that require access to a medium (e.g. air, water, fluid, etc.), for example pressure sensors, are typically packaged in so-called "premold" housings or built up on a circuit board substrate, and capped with a cover made, for example, of steel or plastic. The production of such housings can be technically very complex, and thus very expensive in small production quantities.

SUMMARY OF THE INVENTION

An object of the present invention is therefore to furnish an improved housing for a sensor element.

The object may be achieved according to a first aspect with a housing for a micromechanical sensor element having:
  a cavity in which the sensor element is disposable; and
  a damping element, the micromechanical sensor element being immobilizable in the cavity by way of the damping element in such a way that the damping element and the sensor element together have a substantially common center of mass.

According to a second aspect the object is achieved with a method for manufacturing a sensor device having a micromechanical sensor element, having the steps of:
  constituting a housing having a lead frame, a cavity being constituted in the housing;
  disposing the sensor element in the cavity on the lead frame;
  introducing gel-like damping material into a space between the sensor element and the housing;
  curing the damping material; and
  removing the lead frame beneath the sensor element.

The result is to furnish a sensor housing that "vibratorily disengages" a housed micromechanical sensor element. This means that upon excitation in a lateral direction, the micromechanical sensor element disposed according to the present invention in the housing is damped by way of the damping element precisely in the plane of the excitation. It is furthermore possible, with the specific disposition of the sensor element in the housing, for the micromechanical sensor element to be movable in every spatial direction with no cross-coupling of one direction into another direction. The sensor element thus, upon excitation in one direction, advantageously does not tilt out of the axis of the excitation direction.

The aforesaid effects are achieved thanks to the common center of mass of the damping element and sensor element. Advantageously, the stress-sensitive micromechanical sensor elements can thereby supply accurate sensor signals.

Exemplary embodiments of the housing and of the method are the subject matter of the further descriptions herein.

An embodiment of the housing is notable for the fact that in a process of manufacturing the housing, the damping element is insertable in spatially defined fashion, as a gel-like material, into the cavity of the housing. The damping material can thereby be inserted in simple fashion exactly into the housing. Advantageously, no complex injection molds are needed for manufacture of the damping element.

A further embodiment of the housing provides that the damper material exhibits defined properties, the properties encompassing at least one from the following group: modulus of elasticity, complex modulus of elasticity. The damping element can in this fashion be embodied in such a way that it exhibits the optimum damping properties for the micromechanical sensor element. The modulus of elasticity here defines a resonance zone; the complex modulus of elasticity defines damping properties of the damper material.

A further embodiment of the housing is characterized in that a natural frequency of the damping element is such that no overlap exists in the frequency space between a distribution of natural frequencies of the damping element and a distribution of natural frequencies of the sensor element. This allows optimum damping of an external frequency acting on the housing having the sensor element.

A further embodiment of the housing is characterized in that the housing is a QFN housing or an SOIC housing. This allows the housing according to the present invention to be implemented for various prevalent housing configurations in electronics.

A further embodiment of the housing provides that the housing is a premold housing. This allows a prevalent manufacturing method for manufacturing sensors with a media access to be utilized for the invention.

The invention will be described in detail below, with further features and advantages, on the basis of several Figures. All features described or depicted, individually or in any combination, constitute the subject matter of the invention, regardless of their grouping in the claims or their internal references, and regardless of how they are respectively formulated or depicted in the description or in the Figures. In the Figures, identical or functionally identical elements have the same reference characters.

DETAILED DESCRIPTION

Figure 1:
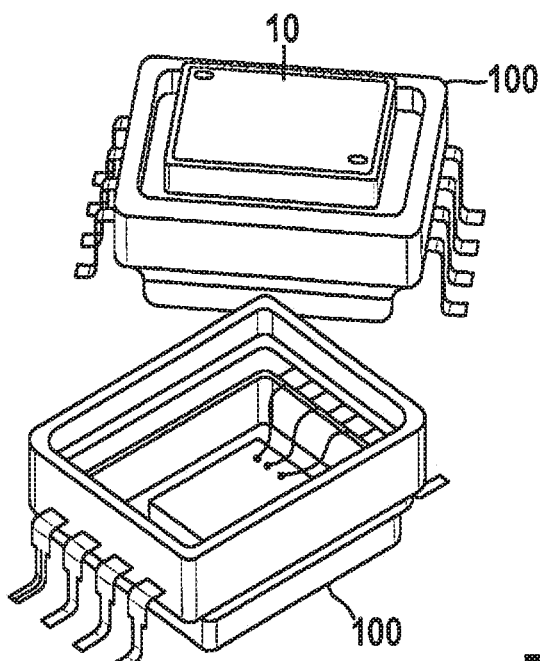
FIG. 1 shows a conventional sensor housing for a micromechanical sensor element.

FIG. 1 shows by way of example, in two perspective views, a housing 100, embodied as a premold housing, for a pressure sensor, a micromechanical sensor element 10 being disposed inside housing 100.

Figure 2:
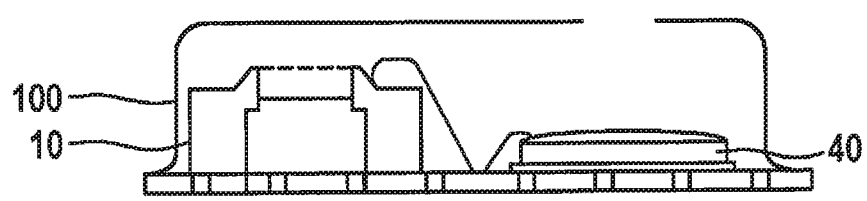
FIG. 2 shows a further conventional sensor housing for a micromechanical sensor element.

FIG. 2 shows by way of example a pressure sensor, built up on a circuit board substrate, having a micromechanical sensor element 10 and an application-specific integrated circuit (ASIC) 40. An opening on the upper side of housing 100, provided for media equalization, is evident.

Housings 100 of FIGS. 1 and 2 are used, for example, for acceleration sensors and rotation rate sensors. The latter have, as a result of the drive concept, an oscillator structure that oscillates at the drive frequency $f_A$. Detection occurs in phase-shifted fashion, also at that frequency $f_A$. If housing 100 of the sensor has an eigenmode in the region of the drive frequency $f_A$, signal delivery then disadvantageously occurs when the external stimulus is not present. This problem is especially critical given that $f_A$ is largely independent of temperature, while the eigenmodes can exhibit a significant temperature dependence. Both sensor element 10 itself and external influences, for example vibrations in a control unit (not depicted), can excite the housing modes. Deleterious external vibrations are generated as a rule in a frame of a motor vehicle (e.g. due to excitation by a stone impact).

Premold housings having dampers are used in order to construct the sensor to be largely robust with respect to vibratory influences from outside. All the measurement elements typically sit on the same damper. Premold housings having dampers are plastic housings in which a base plate (as a rule made of steel) replaces the plastic base. The base plate is, for example, attached with silicone to plastic frames. This combination of base plate and silicone generates the damper function. A further variant of the premold housing having dampers uses a circuit board-based damper housing in order to reduce costs. Spring structures that are injection-embedded into damper gel are implemented in the circuit board.

The aforesaid special housings require a plurality of special processes, however, which as a rule can be very cost-intensive. An injection molding process always requires a special mold, and different housing sizes make a new mold necessary each time. This is relevant in particular when a plurality of different injection molds are necessary because of multiple different sensor sizes.

External vibrations in the control unit (not depicted) can result in interference in the electrical measured signals; the external vibrations, which derive as a rule from passenger car frames, are as a rule in a frequency range between approx. 10 kHz and approx. 15 kHz. In the context of a premold housing having damping materials, the damping is effective only at specific frequencies. The damping is determined by material parameters of the damper material, e.g. silicone.

The requirements in terms of the damper materials greatly limit the available materials. Because of cost, other manufacturing-related boundary conditions limit the use of the premold housing having dampers to a few applications.

A conventional sensor housing that has arms milled in a circuit board, disposed annularly around the sensor element, is not depicted in the Figures. These arms serve as springs, the entire construction also being siliconized. This assemblage is disadvantageous in terms of design because it is not balanced.

In addition, the manufacture of premolds for decoupling different frequencies requires the manufacture of specific, highly complex molds for each case.

Figure 3:
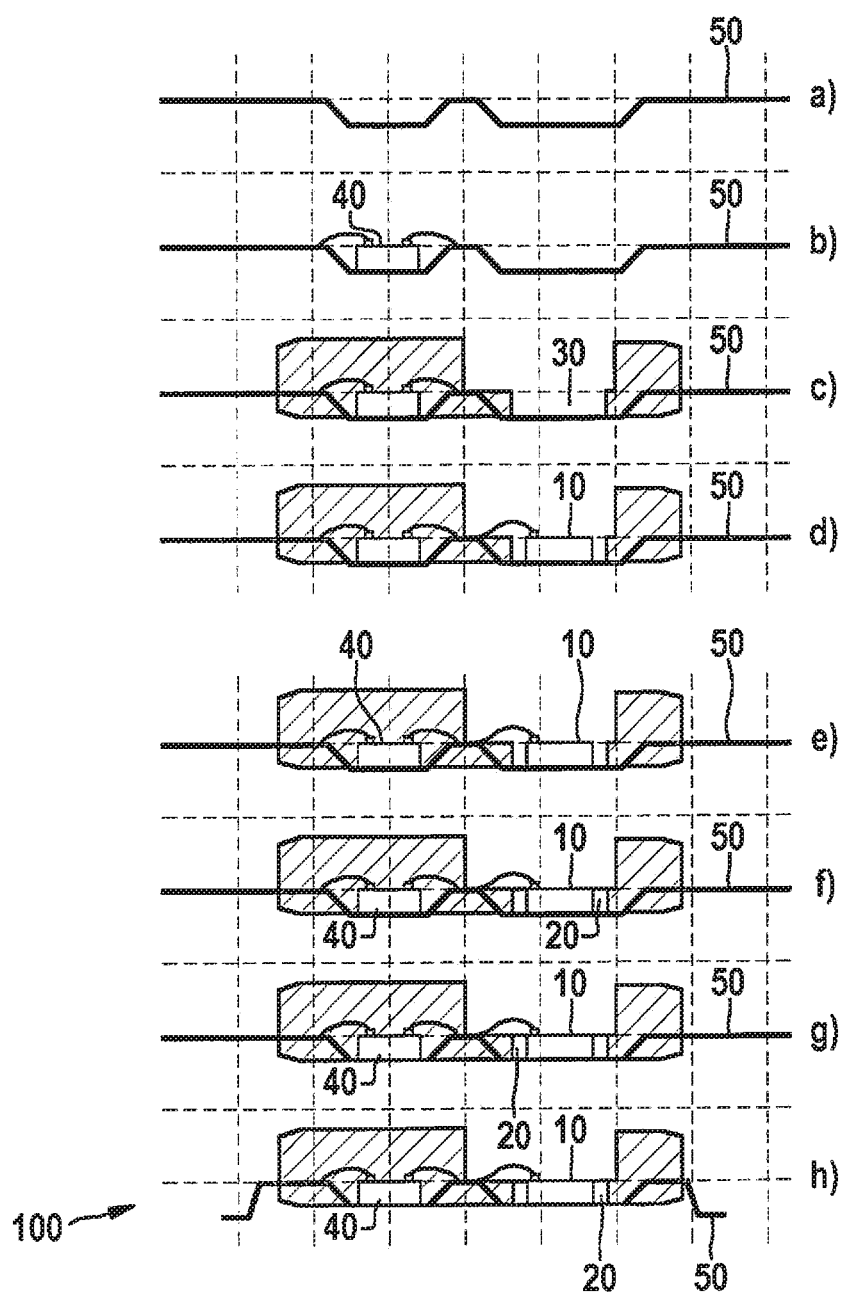
FIG. 3 schematically shows execution of an embodiment of the method according to the present invention.

FIG. 3 shows, in eight illustrations a) to h), a process of manufacturing a housing 100 according to the present invention.

FIG. 3a is a schematic side view of a bent lead frame or "stamped grid" 50, which as a rule is made of copper and is used for a premold housing.

FIG. 3b shows that in a further step, lead frame 50 is fitted with an electrical evaluation circuit 40, i.e. is electrically contacted with bonding wires in a bonding process. One group of bonds ensures external electrical contacting. Other bonds are made on lead frame 50 in order to provide electrical connection to micromechanical sensor element 50 that is fitted later, and/or to a further circuit (not depicted).

FIG. 3c shows that housing 100 is molded using a standard method, i.e. that lead frame 50 is injection-embedded into a plastic material using an injection mold. Electronic evaluation circuit 40, including its bonds, is thereby completely surrounded by molding compound (depicted in black). In addition, a cavity 30 is generated in the molding compound by way of a die (not depicted) in the mold, a base of that cavity 30 being implemented by lead frame 50. An edge, which functions as a gel stop edge, is generated at the sides of cavity 30 by way of the mold.

FIG. 3d schematically shows the placement of micromechanical sensor element 10 in cavity 30, sensor element 10 sitting on lead frame 50.

FIG. 3e indicates that micromechanical sensor element 10 is electrically contacted to lead frame 50 by way of wire bonds.

FIG. 3f shows that in a further production step, cavity 30 is filled with a gel-like damping material 20. The gel-like damping material 20 is applied, or injected or pressed or jetted or disposed in locally defined fashion, into a gap between sensor element 10 and the gel stop edge of the molding compound, with the result that micromechanical sensor element 10 is surrounded on all sides with gel. Cavity 30 is closed off at the bottom by lead frame 50, so that damping material 20 cannot run out.

The properties of the gel determine the subsequent frequency-dependent damping effect of the cured damping element 20 for sensor element 10 inside housing 100. The damping properties of sensor element 10 can thus be adapted, by way of specific parameters, to the external driving frequency or exciting frequency. These parameters encompass, for example, a modulus of elasticity, which defines a resonant frequency; and a complex modulus of elasticity, which characterizes damping properties.

Damping material 20 is then heated for a defined length of time, causing it to cure. For silicones, a temperature used for this is typically in the range of approx. 150° C. The result is that sensor element 10 is, so to speak, "suspended in mid-air" and is vibratorily disengaged in the sense defined above.

FIG. 3g shows schematically that in a selective etching step, lead frame 50 is removed in the region of cavity 30 and in the region of evaluation circuit 40. The result is that micromechanical sensor element 10 is disengaged and is now "suspended" freely in the cured, elastic damping element 20. Corresponding etching methods, for example for Quad Flat No-Lead (QFN) package housings, are very prevalent and therefore inexpensive. The aforesaid etching methods are used to achieve minimal rewiring in the QFN housing.

FIG. 3h shows that in a final step, housing 100 is singulated and the fingers of lead frame 50 are bent to produce feet. These feet bring about additional damping of housing 100, as well as stress decoupling with respect to the circuit board (not depicted).

Figure 4:
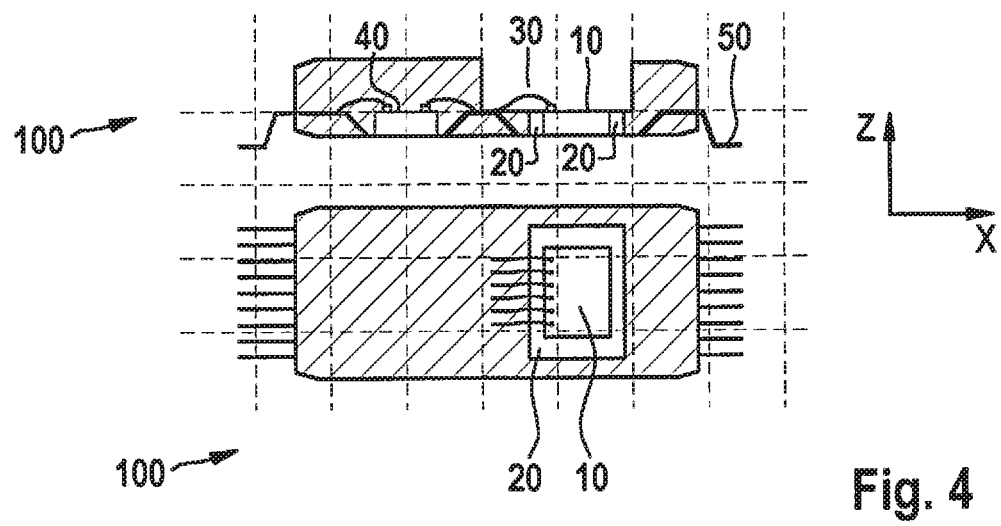
FIG. 4 shows an embodiment of a housing according to the present invention.

FIG. 4 shows an embodiment of housing 100 in a front view and a plan view. It is evident that micromechanical sensor element 10 is symmetrically surrounded in cavity 30 by way of damping element 20, and in that fashion is optimally damped with regard to external vibration excitations. The result, by way of this specific balanced immobilization of sensor element 10 inside cavity 30 of housing 100, is to help prevent the generation of any rotational or tilting motions of sensor element 10 when sensor element 10 is excited linearly in a defined direction. A prerequisite for this is that the centers of mass of sensor element 10 and of damping element 20 coincide.

Although this above-described effect is achieved with a damping element 20 that is disposed exclusively laterally with respect to sensor element 10, the aforesaid effect can of course also be achieved when damping element 20 is additionally disposed above and below sensor element 10, so that a "fully encapsulated" sensor element 10, so to speak, is thereby implemented.

This applies, advantageously, to all spatial directions. The result, in terms of theoretical physics, is that for each motion direction it is possible to obtain an individual mathematical solution that does not couple into other spatial directions. This is based on the fact that the center of mass of sensor element 10 is embedded symmetrically into damping element 20, or that the centers of mass of damping element 20 and sensor element 10 substantially coincide.

Provision is advantageously made that in the frequency space, no overlap at all occurs between a propagation of oscillation modes or a distribution of natural frequencies of damping element 20, and a distribution of natural frequencies of sensor element 10. In other words, this means that the oscillation modes of damping element 20 and sensor element 10 are disjunct in the frequency space. A very good damping effect for damping element 20 can thereby be achieved.

Figure 5:
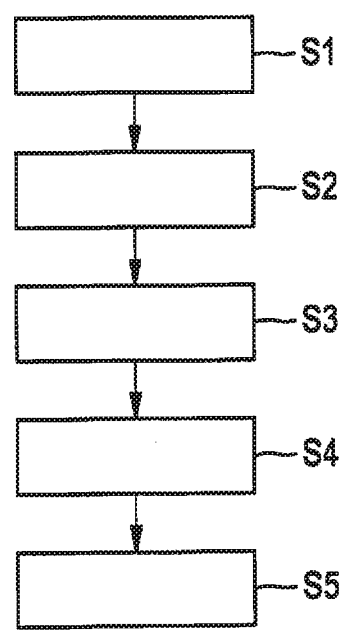
FIG. 5 schematically shows execution of an embodiment of the method according to the present invention.

FIG. 5 schematically shows execution of an embodiment of the method for manufacturing a sensor device having a micromechanical sensor element.

In a first step S1, a housing 100 having a lead frame 50 is constituted, a cavity 30 being constituted in housing 100.

In a second step S2, sensor element 10 is disposed in cavity 30 on lead frame 50.

In a third step S3, gel-like damping material is introduced into a space between sensor element 10 and housing 100.

In a fourth step S4, the damping material is cured.

Lastly, in a fifth step S5, lead frame 50 beneath sensor element 10 is removed.

In an embodiment of housing 100 which is not depicted in Figures, provision can also be made that a further electrical circuit above or alongside evaluation circuit 40 is additionally fitted, and this assemblage is then injection-embedded. For a combination sensor cluster this additional sensor can be, for example, an acceleration sensor.

In addition to the embodiment described here which is based on a small outline integrated circuit (SOIC), any desired QFN-like housing can also be implemented using identical methods. The advantage here is better utilization of the area of lead frame 50 as compared with the embodiment having an SOIC housing.

Figure 6:
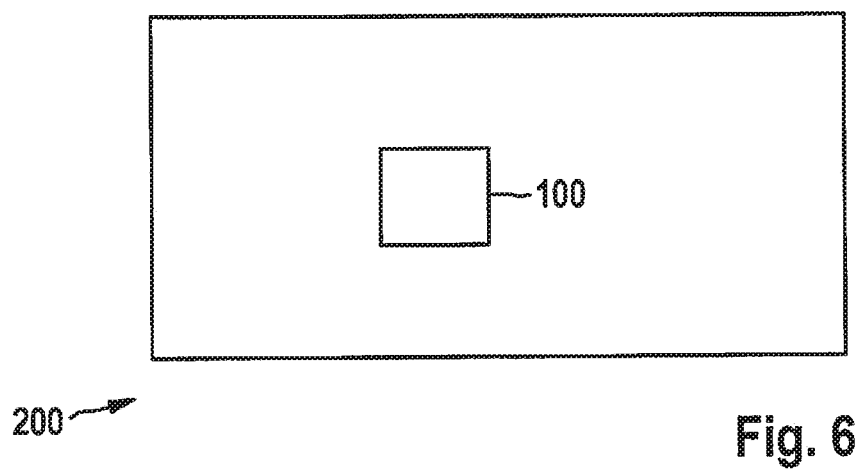
FIG. 6 is a schematic depiction of a sensor device having the housing according to the present invention.

FIG. 6 shows, in highly simplified fashion, a sensor device 200 that has a housing 100 having a micromechanical sensor element 10 disposed therein.

The present invention advantageously eliminates limitations in terms of housing production and further processing. The invention thus advantageously enables implementation of a universal, cost-attractive concept that can be implemented in the context of housing packaging without any special processes.

The present invention thus enables simple adaptation of the damper characteristics of sensor housings, so that development times can be significantly shortened.

In summary, the present invention furnishes an improved housing for stress- or vibration-sensitive micromechanical sensors or other components. Because molds need only minor changes as compared with known methods, an inexpensive and thus economical implementation of the manufacturing method according to the present invention can be implemented. Thanks to the simpler mold configuration, a simple and inexpensive manufacturing method can thus be implemented, with which method the sensor housing according to the present invention, having a balanced sensor element, can be efficiently manufactured in large production volumes.

Advantageously, only standard processes are required in order to manufacture, according to the present invention, the sensor housing. Simple identification of "second sources," and thus supply security, are thus supported in simple fashion. Lead frame-based processes are moreover among the most inexpensive manufacturing processes available on the market.

Although the invention has been described with reference to concrete embodiments, it is in no way limited thereto. One skilled in the art will therefore modify the features described above, or combine them with one another, without deviating from the essence of the invention.

What is claimed is:

1. A housing for a micromechanical sensor element, comprising:
   a cavity in which the sensor element is disposable; and
   a damping element, wherein the sensor element has a plurality of sides, a top, and a bottom, and is suspended from the cavity in the damping element, the damping element extending from the sides of the sensor element to walls of the cavity, and the sensor element is immobilized in the cavity by the damping element so that the damping element has a center of mass that substantially coincides with a center of mass of the sensor element.

2. The housing of claim 1, wherein in a process of manufacturing the housing the damping element is insertable in spatially defined fashion, as a gel-like material, into the cavity of the housing.

3. The housing of claim 2, wherein the material exhibits defined properties, the properties encompassing at least one from the following group: modulus of elasticity, complex modulus of elasticity.

4. The housing of claim 1, wherein no overlap exists between a distribution of natural frequencies of the damping element and a distribution of natural frequencies of the sensor element.

5. The housing of claim 1, wherein the housing is one of a QFN housing and an SOIC housing.

6. The housing of claim 1, wherein the housing includes a premold housing.

7. The housing of claim 1, wherein the damping element is disposed above and below the sensor element.

8. The housing of claim 1, further comprising a lead frame with an aperture spanning the sensor element and damping material.

9. The housing of claim 1, further comprising an evaluation circuit component separate from the sensor element.

10. The housing of claim 1, further comprising a molding element in which the cavity is formed.

11. A sensor device, comprising:
   a housing for a micromechanical sensor element, including a cavity in which the sensor element is disposed, and a damping element; and
   the micromechanical sensor element, wherein the sensor element has a plurality of sides, a top, and a bottom, and is suspended from the cavity in the damping element, the damping element extending from the sides of the sensor element to walls of the cavity, and the sensor element is situated in the housing so as to be immobilized in the cavity by the damping element so that the damping element has a center of mass that substantially coincides with a center of mass of the sensor element.

12. The sensor device of claim 11, wherein the sensor device includes a micromechanical sensor element.

13. The sensor device of claim 11, wherein no overlap exists between a distribution of natural frequencies of the damping element and a distribution of natural frequencies of the sensor element.

14. A method for manufacturing a sensor device having a micromechanical sensor element, the method comprising:
   constituting a housing having a lead frame, a cavity being constituted in the housing;
   disposing the sensor element in the cavity on the lead frame;
   introducing a gel-like damping material into a space between the sensor element and the housing;
   curing the damping material; and
   removing the lead frame beneath the sensor element.

15. The method of claim 14, wherein the gel-like damping material is constituted so that in the cured state no overlap exists between a distribution of natural frequencies of the damping element and a distribution of natural frequencies of the sensor element.

16. The method of claim 14, wherein the micromechanical sensor element is immobilized in the cavity by the damping element so that the damping element and the sensor element have centers of mass that substantially coincide.

17. The method of claim 14, wherein the sensor element has a plurality of sides, a top, and a bottom, and is suspended from the cavity in the damping element, the damping element extending from the sides of the sensor element to walls of the cavity, and the sensor element is situated in the housing so as to be immobilized in the cavity by the damping element so that the damping element has a center of mass that substantially coincides with a center of mass of the sensor element.

* * * * *